(12) United States Patent
Van Herpen et al.

(10) Patent No.: US 8,665,420 B2
(45) Date of Patent: Mar. 4, 2014

(54) SPECTRAL PURITY FILTER AND LITHOGRAPHIC APPARATUS

(75) Inventors: Maarten Marinus Johannes Wilhelmus Van Herpen, Heesch (NL); Wouter Anthon Soer, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 444 days.

(21) Appl. No.: 13/060,581

(22) PCT Filed: Jul. 29, 2009

(86) PCT No.: PCT/EP2009/005487
§ 371 (c)(1), (2), (4) Date: Feb. 24, 2011

(87) PCT Pub. No.: WO2010/022839
PCT Pub. Date: Mar. 4, 2010

(65) Prior Publication Data
US 2011/0149262 A1    Jun. 23, 2011

Related U.S. Application Data

(60) Provisional application No. 61/136,331, filed on Aug. 28, 2008, provisional application No. 61/193,202, filed on Nov. 5, 2008.

(51) Int. Cl.
*G03B 27/72* (2006.01)
*G03B 27/54* (2006.01)

(52) U.S. Cl.
USPC .............................................. 355/71; 355/67

(58) Field of Classification Search
USPC ................... 355/71, 67; 250/492.2
See application file for complete search history.

(56) References Cited

U.S. PATENT DOCUMENTS

| 5,086,443 A | 2/1992 | Bloch et al. |
| 5,962,854 A * | 10/1999 | Endo ........................ 250/349 |
| 7,515,336 B2 | 4/2009 | Lippey et al. |
| 2004/0233524 A1 | 11/2004 | Lippey et al. |
| 2006/0145094 A1 | 7/2006 | Van Herpen et al. |
| 2007/0262407 A1* | 11/2007 | Schimert et al. ............ 257/432 |
| 2009/0128906 A1* | 5/2009 | Stiens et al. ................. 359/487 |

FOREIGN PATENT DOCUMENTS

| CN | 1854771 | 11/2006 |
| CN | 101960338 | 1/2011 |
| EP | 1717609 A1 | 11/2006 |
| JP | 6-174897 | 6/1994 |
| JP | 2005-191497 | 7/2005 |

(Continued)

OTHER PUBLICATIONS

International Search Report for PCT International Patent Applicaton No. PCT/EP2009/005487, mailed Apr. 20, 2010.
Chinese Office Action dated Nov. 29, 2012 in corresponding Chinese Patent Application No. 200980133185.0.
Japanese Office Action mailed Aug. 15, 2013 in corresponding Japanese Patent Application No. 2011-524215.

*Primary Examiner* — Peter B Kim
(74) *Attorney, Agent, or Firm* — Pillsbury Winthrop Shaw Pittman LLP (57) ABSTRACT

A spectral purity filter is configured to reflect extreme ultraviolet radiation. The spectral purity filter includes a substrate, and an anti-reflective coating on a top surface of the substrate. The anti-reflective coating is configured to transmit infrared radiation. The filter also includes a multi-layer stack configured to reflect extreme ultraviolet radiation and to substantially transmit infrared radiation.

15 Claims, 7 Drawing Sheets

(56) References Cited

FOREIGN PATENT DOCUMENTS

| JP | 2006-173490 | 6/2006 |
| JP | 2006216783 A | 8/2006 |
| JP | 2006-235595 | 9/2006 |
| JP | 2006-310793 | 11/2006 |
| JP | 2007-88237 | 4/2007 |
| JP | 2010-272677 | 12/2010 |
| WO | 2009106291 A1 | 9/2009 |

* cited by examiner

Si/Mo d=6.9nm s=0.nm N=40 at 90.deg. P=1.

FIG. 4

Si/C d=6.9nm s=0.nm N=40 at 90.deg. P=1.

SPECTRAL PURITY FILTER AND LITHOGRAPHIC APPARATUS

CROSS-REFERENCE TO RELATED APPLICATIONS

This application is the National Phase entry of PCT/EP2009/005487, filed Jul. 29, 2009, which claims the benefit of U.S. provisional application 61/136,331, which was filed on Aug. 28, 2008 and of U.S. provisional application 61/193,202, which was filed on Nov. 5, 2008, and both of which are incorporated herein in their entirety by reference.

FIELD

The present invention relates to a spectral purity filter, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to be able to project ever smaller structures onto substrates, it has been proposed to use extreme ultraviolet (EUV) radiation which is electromagnetic radiation having a wavelength within the range of 10-20 nm, for example within the range of 13-14 nm. It has further been proposed that EUV radiation with a wavelength of less than 10 nm could be used, for example within the range of 5-10 nm, for example 6.7 nm or 6.8 nm.

Radiation may be produced using plasma. The plasma may be created, for example, by directing a laser at particles of a suitable material (e.g. tin), or by directing a laser at a stream of a suitable gas or vapor, such as Xe gas or Li vapor. The resulting plasma emits output radiation, e.g., EUV radiation, which is collected using a collector such as a mirrored grazing incidence collector, which receives the radiation and focuses the radiation into a beam. Such a radiation source is typically termed a laser produced plasma (LPP) source.

Japanese publication JP2006216783 describes a multi-layer film reflecting mirror which can eliminate a need for light exposure and can previously absorb exciting light which involves thermal expansion of the reflecting mirror. According to this publication, an exciting-light reflection preventive film is formed on a quartz substrate, and an exposure-light reflecting film is formed thereon. Exciting light having a long wavelength passes through the exposure-light reflecting film, and reaches the exciting light reflecting preventive film where the exciting light is absorbed.

JP2006216783 describes two particular embodiments to reduce transmission of laser beam light, at a certain oblique angle of incidence (of 13.5 degrees). In a first embodiment, reflectance of 1064 nm excitation light is about 24%, utilizing an antireflection film comprising several layers of Mo, $SiO_2$, and Si. A second example provides 40% reflectance of 266 nm excitation light, utilizing an antireflection film of $HfO_2$, $SiO_2$, and $MgF_2$ layers.

SUMMARY

A radiation source may output secondary radiation in addition to the desired radiation. For example, a EUV plasma radiation source may output secondary radiation having a wavelength selected from the range of 20-400 nm in addition to desired EUV radiation, most notably in the deep ultraviolet (DUV) range (100-400 nm). For example, secondary radiation may arise in a LPP radiation source due to the laser used to generate the plasma, the laser radiation having a wavelength longer than EUV radiation (for example infrared radiation, for example 10.6 μm wavelength radiation from a $CO_2$ laser).

When using an LPP source, the laser radiation itself represents a significant amount of unwanted radiation that may be emitted into the lithographic apparatus by scattering and reflection at the plasma. Typically, a $CO_2$ laser having a wavelength of around 10.6 μm (i.e., infrared (IR) radiation) is used. Since the optics of the EUV lithographic apparatus have a high reflectivity at 10.6 μm, the infrared radiation may propagate into the lithographic apparatus with significant power. Part of this power may eventually be absorbed by the substrate (e.g., wafer), which may cause unwanted heating of the substrate.

In addition to infrared radiation, it is desirable to suppress deep ultraviolet radiation, because the EUV resist on the substrate is also sensitive to deep ultraviolet wavelengths, which may cause unwanted contrast-loss.

In lithography, it is desirable to improve spectral purity, i.e., to remove secondary radiation from the output beam to yield a higher proportion of desired radiation. Since the optics of an EUV lithographic apparatus has a high reflectivity (for example, for 10.6 μm wavelength secondary radiation from a LPP source), the secondary radiation may reach the substrate with significant power. Additionally or alternatively, the secondary radiation, particularly the laser radiation in a LPP radiation source, may lead to undesired heating of the patterning device, substrate, and/or optics.

It is desirable to make a spectral purity filter that is configured to filter out at least unwanted infrared radiation at a low cost of EUV power.

Accordingly, it is desirable to provide, for example, a spectral purity filter for use in a radiation source or in a lithographic apparatus, wherein undesirable radiation may be removed completely or partially.

According to an aspect of the invention, there is provided a spectral purity filter configured to transmit or absorb non-EUV secondary radiation and to reflect extreme ultraviolet (EUV) radiation.

According to an aspect of the invention, there is provided a spectral purity filter configured to reflect extreme ultraviolet radiation. The spectral purity filter can include a substrate, and an anti-reflective coating (i.e. anti-reflective structure) on a top surface of the substrate. The anti-reflective coating is configured to transmit infrared radiation. The spectral purity filter also includes a multi-layer stack. The multi-layer stack is configured to reflect extreme ultraviolet radiation and to substantially transmit infrared radiation. For example, the infrared radiation that is transmitted can be radiation having a wavelength larger than about 1 μm, particularly larger than about 10 μm, for example about 10.6 μm.

According to an aspect of the invention, there is provided a lithographic apparatus. The apparatus may include an illumination system configured to condition a beam of radiation comprising extreme ultraviolet radiation, and a support configured to support a patterning device. The patterning device is configured to pattern a beam of radiation that includes extreme ultraviolet radiation. The apparatus may also include a projection system configured to project a patterned beam of radiation onto a substrate, and a spectral purity filter configured to reflect extreme ultraviolet radiation. The spectral purity filter may be located in the illumination system or the projection system. The spectral purity filter as such may include a substrate, and an anti-reflective coating on a top surface of the substrate. The anti-reflective coating may be configured to transmit infrared radiation. The spectral purity filter may also include a multi-layer stack, for example on a top surface of the anti-reflective coating. The multi-layer stack may be configured to reflect extreme ultraviolet radiation and to substantially transmit infrared radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
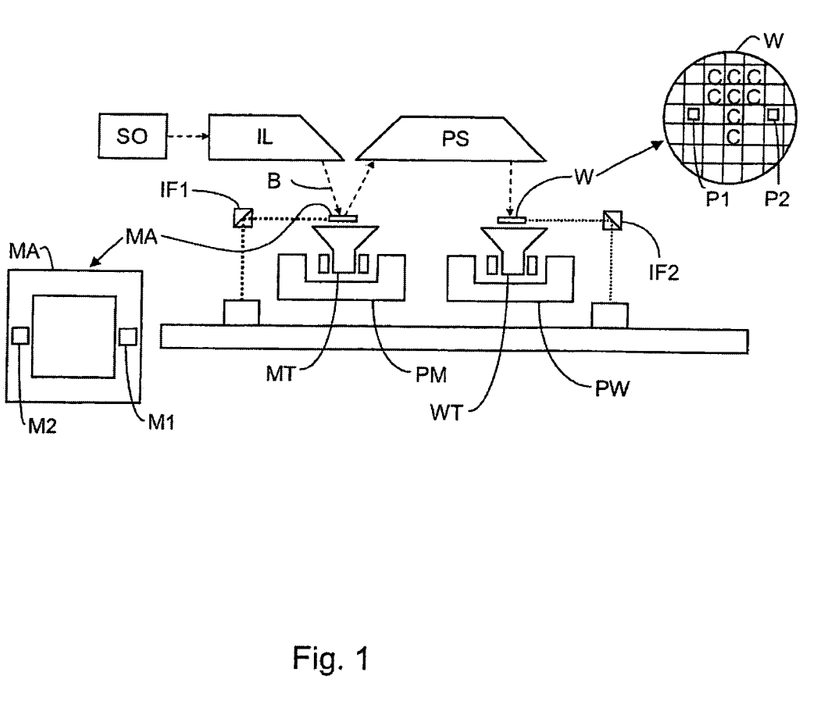
FIG. 1 schematically depicts a lithographic apparatus according to an embodiment of the invention.

FIG. 1 schematically depicts a lithographic apparatus according to an embodiment of the invention. The apparatus comprises: an illumination system (illuminator) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus is of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source includes a $CO_2$ laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
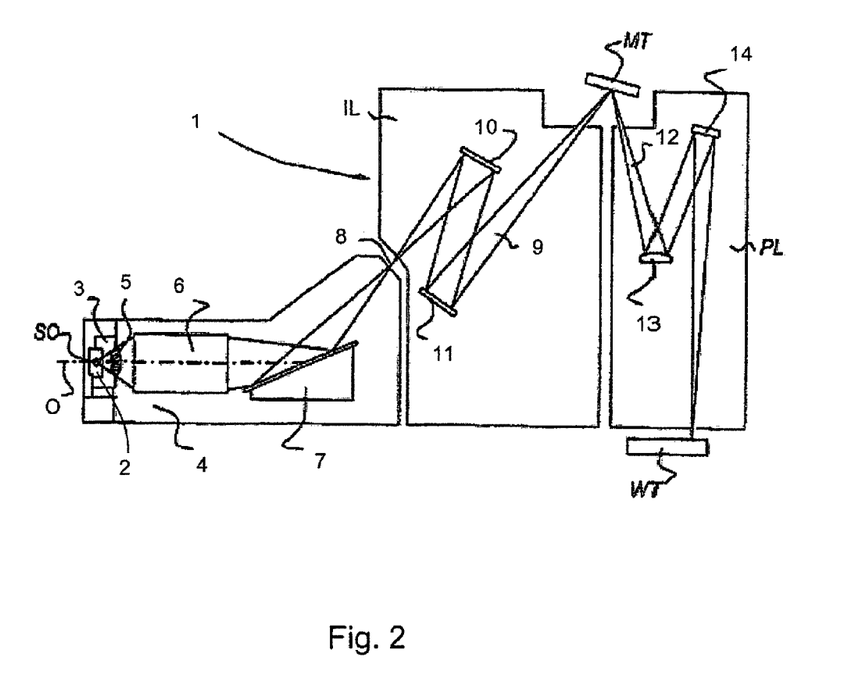
FIG. 2 depicts a detailed schematic illustration of a lithographic apparatus according to an embodiment of the invention.

FIG. 2 shows the lithographic apparatus 1 in more detail, including the radiation source SO, the illumination optics unit IL, and the projection system (depicted in FIG. 2 as PL). The radiation source SO includes a radiation emitter 2 which may comprise a discharge plasma. EUV radiation may be produced by a gas or vapor, such as Xe gas or Li vapor in which a very hot plasma is created to emit radiation in the EUV radiation range of the electromagnetic spectrum. The very hot plasma is created by causing a partially ionized plasma of an electrical discharge to collapse onto an optical axis O. Partial pressures of e.g. Pa of Xe or Li vapor or any other suitable gas or vapor may be desired for efficient generation of the radiation. In some embodiments, tin may be used. The radiation emitted by radiation emitter 2 is passed from a source chamber 3 into a collector chamber 4. In an embodiment, the radiation source SO includes the source chamber 3 and collector chamber 4.

The collector chamber 4 includes a contamination trap 5 and grazing incidence collector 6 (shown schematically as a rectangle). Radiation allowed to pass through the collector 6 is reflected off a grating spectral filter 7 to be focused in a virtual source point 8 at an aperture in the collector chamber 4. From collector chamber 4, a beam of radiation 9 is reflected in illumination optics unit IL via first and second normal incidence reflectors 10, 11 onto a patterning device (e.g., a mask) positioned on support structure MT. A patterned beam 12 is formed which is imaged in projection system PL via first and second reflective elements 13, 14 onto a substrate (not shown) held on a substrate table WT. More elements than shown may generally be present in illumination optics unit IL and projection system PL.

Figure 3:
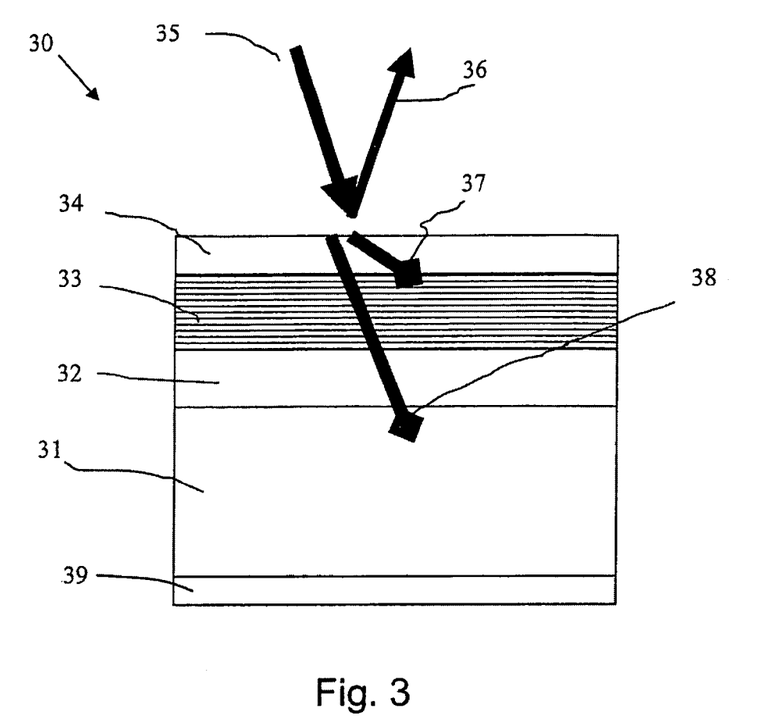
FIG. 3 depicts a spectral purity filter according to an embodiment of the invention.
Figure 6:
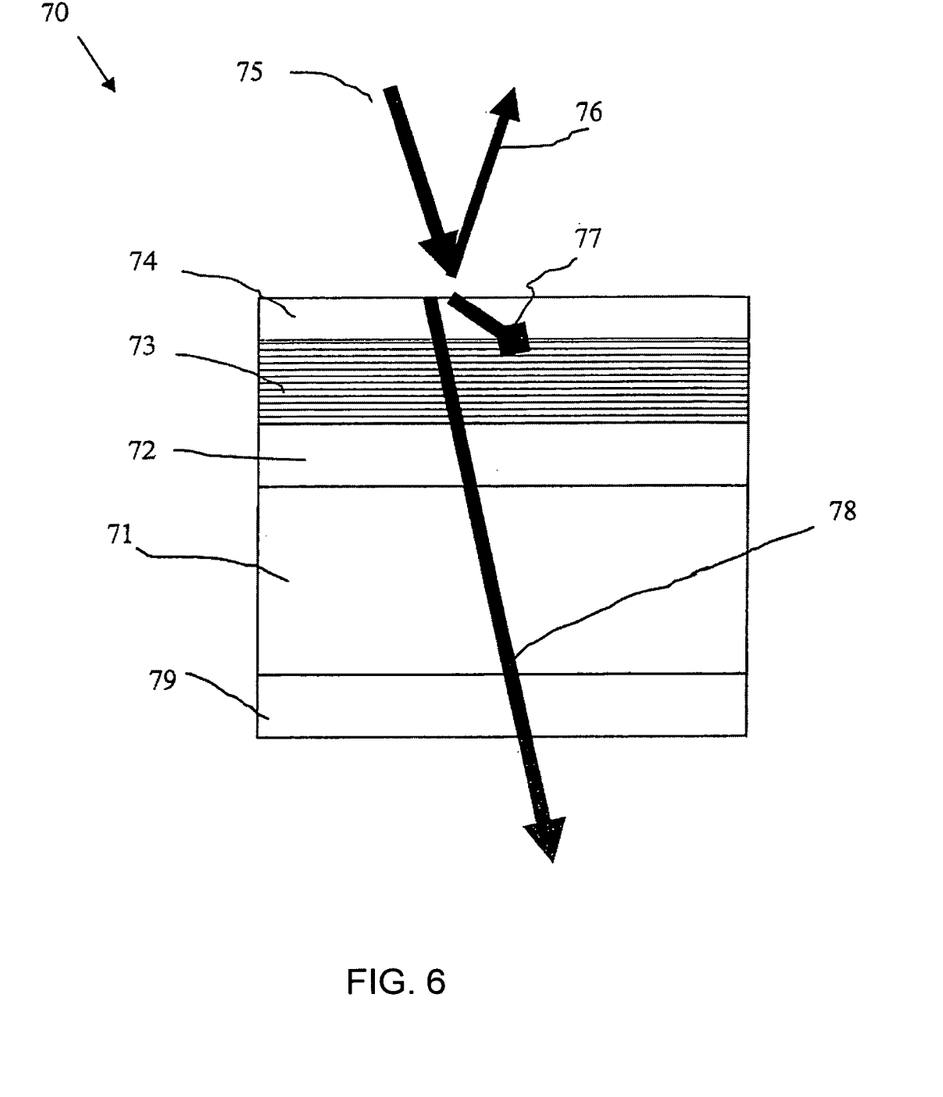
FIG. 6 depicts a spectral purity filter according to an embodiment of the invention.
Figure 7:
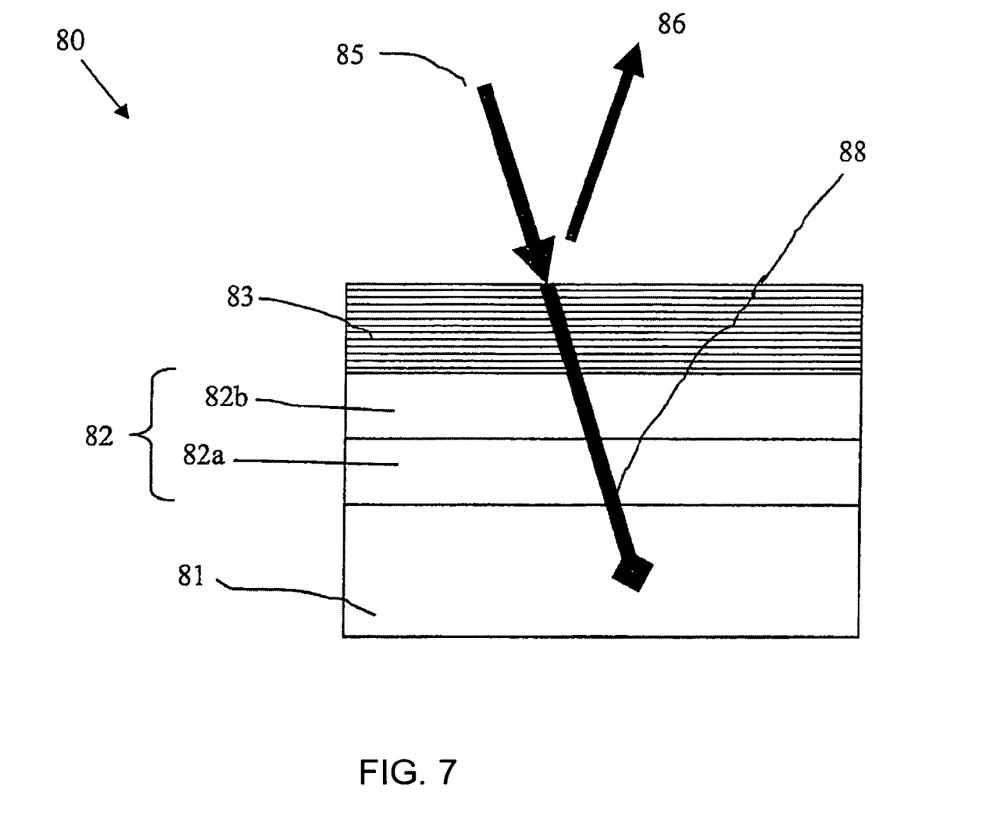
FIG. 7 depicts a spectral purity filter according to an embodiment of the invention.

To improve spectral purity of the radiation that passes through the illumination optics unit IL and the projection system PL, a spectral purity filter for use in or with an EUV source may be used. FIG. 3 illustrates an embodiment of a spectral purity filter 30, which may be in the form of a normal-incidence multi-layer EUV mirror. Other non-limiting embodiments of the spectral purity filter (represented by 70 and 80) are illustrated in FIGS. 6 and 7, respectively.

For example, the spectral purity filter can be configured to substantially absorb infrared radiation. In an alternative embodiment (see below), the filter can be configured to substantially transmit infrared radiation. In yet another embodiment, the filter can be configured to absorb part of incoming infrared radiation and to transmit another part of incoming infrared radiation. Also, according to an embodiment, the filter is configured to filter is configured to suppress reflection of incoming deep UV radiation.

In each case, desirably, the spectral purity filter 30, 70, 80 is configured to reflect not more than 50% of incoming infrared radiation, desirably not more than 20%, and more particularly not more than 2%.

Also, desirably, the spectral purity filter 30, 70, 80 is configured to reflect more than 50% of incoming EUV radiation.

Besides, desirably, the spectral purity filter is also configured to suppress reflection of DUV radiation (having a wavelength range of 100-400 nm). For example, the spectral purity filter can be configured to reflect not more than 50% of incoming DUV radiation, desirably not more than 40% of that radiation.

In the present embodiment (see FIG. 3), the spectral purity filter 30 includes an infrared absorbing substrate 31, an infrared anti-reflection coating (i.e. anti-reflective structure) 32 located on a top surface of the infrared absorbing substrate 31, a multi-layer EUV mirror stack 33 that is at least substantially transparent for infrared radiation and that may be located on a top surface of the anti-reflection coating 32. The spectral purity filter 30 may optionally include a capping layer 34, as shown in FIG. 3. Alternatively, for example, the anti-reflective structure can be at least partly provided by the multi-layer EUV mirror stack 33 as such. For example, the anti-reflection coating as such can include a single layer, or a stack of layers, or it can have a different configuration.

For example, the a multi-layer mirror stack 33 can be configured to transmit more than 50% of incoming infrared radiation, particularly more than 80% and more particularly more than 98%.

An incoming radiation beam 35 that includes EUV, DUV and infrared radiation is incident on the spectral purity filter 30 such that the EUV radiation is transmitted through the (optional) capping layer 34 and is then reflected by the multi-layer mirror 33, as represented by 37. This allows the EUV to be reflected by the spectral purity filter 30, as represented 36. The infrared radiation is transmitted through the capping layer 34, and the multi-layer stack 33, and due to the anti-reflection coating 32, the infrared radiation is eventually absorbed at substrate 31, as represented by 38. For example, the substrate 31 can be configured to absorb more than 80% and desirably more than 99%, of, for example all, incoming infrared radiation (being transmitted to the substrate from the anti-reflection coating 32).

The anti-reflection coating 32 beneath the multi-layer stack 33, relative to the incoming radiation, and the multi-layer stack 33 is (at least substantially) non-reflective to the infrared radiation. In this way, the anti-reflection coating may reduce the reflection of infrared radiation from the top surface of the substrate while leaving the EUV reflectivity substantially unaffected.

Figure 5:
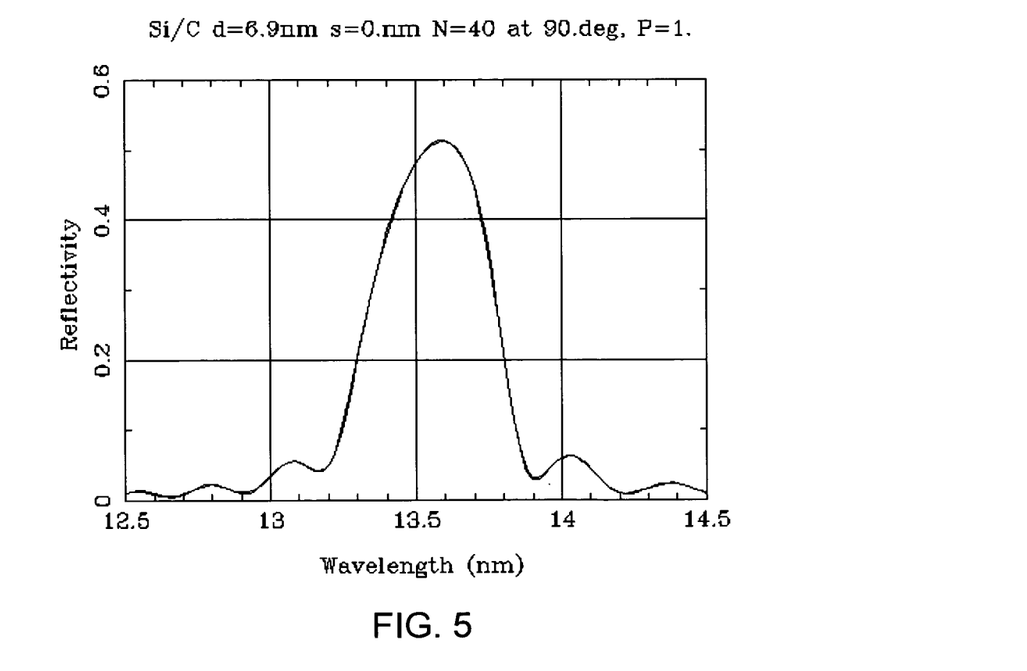
FIG. 5 is a graphical representation of reflectivity of a multi-layer mirror according to an embodiment of the invention that has a Si/DLC (diamond-like carbon) multilayer stack.

In an embodiment, the multi-layer stack 33 is a multi-layer mirror comprising alternating layers of Si and diamond-like carbon (DLC) and is used on an infrared absorbing substrate 31 with a ZnSe/ThF$_4$ anti-reflection coating 32. FIG. 5 shows reflectivity of a multi-layer mirror that has a Si/DLC multi-layer stack.

Typical suppression factors are 50 for 10.6 μm radiation at a typical efficiency of 70-80% in terms of EUV transmission (compared to a conventional Mo/Si multi-layer mirror). An additional spectral purity enhancing (SPE) layer may be added for DUV suppression (at a cost of 5% EUV loss for a factor of 5 DUV suppression).

For example, the absorbing substrate layer 31 may be SiO$_2$, Al$_2$O$_3$, Si, or TaN, although any infrared absorbing material may be used. In the present embodiments, the thickness of the substrate of the spectral purity filter may be at least about 50 μm and may be up to several mm.

According to non-limiting embodiments, the anti-reflection coating 32 may include any suitable anti-reflective infrared coating material, such as, for example, one or more of: Ge, ZnSe, ZnS, YF$_3$ and/or ThF$_4$.

The multi-layer stack 33 is desirably transparent for infrared radiation, while at the same time is configured to provide a high EUV reflectivity. Suitable materials for the multi-layer stack include, but are not limited to, ZrN, ZrC, diamond, diamond-like carbon, carbon, and/or Mo$_2$C.

The capping layer 34 is desirable a substantially infrared transparent material. Examples of such a material include, but are not limited to Si$_3$N$_4$, diamond-like carbon, and carbon.

Figure 4:
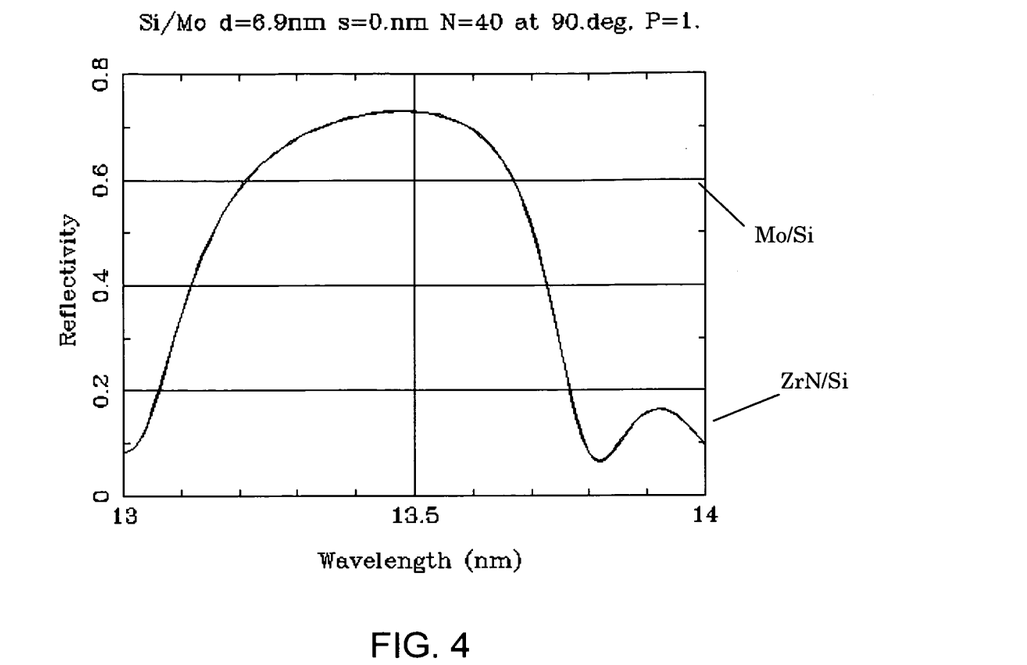
FIG. 4 is a graphical representation of reflectivity of a multi-layer mirror having a Si/Mo multi-layer stack.

FIGS. 4 and 5 compare the EUV reflectivity of several multi-layer mirrors, calculated with CXRO. FIG. 4 shows a reference Mo/Si multi-layer mirror with 73% EUV reflectivity. FIG. 5 shows an embodiment of the spectral purity filter with a multi-layer stack of DLC/Si with a peak reflectivity of 51.3%. It can be seen that a DLC/Si multi-layer mirror (FIG. 5) has an EUV reflectivity of 51.3% (based on a DLC density of 2.7 g/cm$^3$), which is 70% of the reflectivity of a commonly used Mo/Si mirror (FIG. 4). Thus, if DLC is used, the effective transmission of the spectral purity filter is about 70%.

In one example, the spectral purity filter includes a ZrN/Si multi-layer mirror, with a layer of 750 nm ThF4 and a layer of 1250 nm ZnSe underneath as the infrared anti-reflective coating. The anti-reflective properties of an embodiment of the invention are a combined effect of the anti-reflective coating and the DLC/Si multilayer. The efficiency of the spectral purity filter is shown in FIGS. 4-5, where a comparison is shown with a reference Mo/Si multi-layer mirror. It can be seen that embodiments of the spectral purity filter of the invention suppresses the 10.6 μm light by a factor of 65.

The use of a SPE layer on top of the multilayer is illustrated in FIG. 3, where deep UV radiation 37 is absorbed in the multi-layer mirror 33, due to the SPE capping layer 34.

Since a significant amount of heat may be absorbed in the absorbing layer 31 (i.e., the substrate), appropriate measures may be taken to prevent thermal damage to the spectral purity filter 30. In an embodiment, the substrate 31 may be another substrate or may have a backing plate 39 made of a material with high thermal conductivity, for example copper (Cu). The backing plate 39 may be cooled by active or passive cooling means, e.g. water cooling. In an embodiment, the thickness of the absorbing layer 1 is kept as low as needed for IR absorption, in order to facilitate the heat transfer to the backing plate.

In an embodiment, diffusion barrier layers may be provided between the subsequent layers of the multilayer mirror. The diffusion barrier layers should also be substantially non-reflective to infrared radiation. In an embodiment, the diffusion barrier layers may include B$_4$C.

As is mentioned above, in an alternative embodiment, the filter is configured to substantially transmit infrared radiation. For example, the overall filter 70 can be configured to transmit more than 50% of incoming infrared radiation 78, particularly more than 80% and more particularly more than 95%.

For example, in an embodiment of a spectral purity filter 70 (illustrated in FIG. 6), a substrate 71 is transparent for infrared radiation. For example, the substrate 71 can be configured to transmit more than 50% of infrared radiation (transmitted to the substrate 71 from multi-layer stack 73), particularly more than 80% and more particularly more than 95%.

For example, the backside of the substrate 71 (the backside being faced away from the multi-stack layer 73) may be coated with an infrared anti-reflection coating 79.

As illustrated, the filter 70 also includes an anti-reflection coating 72 on top of the substrate 71, a multi-layer stack 73 on top of the anti-reflection coating 72, and a capping layer 74 on top of the multi-layer stack 73. Incoming radiation 75, which includes at least EUV and infrared radiation is incident on the filter 70. Due to the properties of the various layers 74, 73, 72, 71, and 79 of the filter 70, EUV radiation 76 is reflected off of the multi-layer stack 73, as represented by 77, and infrared radiation 78 is transmitted all the way through the filter 70.

A potential advantage of the embodiment illustrated in FIG. 6 is that the infrared radiation is substantially not absorbed in the mirror 70, but instead the infrared radiation is substantially transmitted to the backside of the mirror 70, where it can be absorbed in a dedicated beam dump with proper cooling. This may significantly reduce the heat-load of the spectral purity filter 70.

In an embodiment, a spectral purity filter 80 in the form of an infrared transparent multi-layer mirror is provided, as shown in FIG. 7. The embodiment of FIG. 7 differs from the above-described embodiments, in that the multi-layer mirror structure is a Si/diamond multi-layer stack 83. In the present embodiment, the Si/diamond multi-layer stack 83 is deposited on top of an infrared anti-reflection coating 82.

As illustrated in FIG. 7, the anti-reflection coating 82 may include two layers, 82a, 82b, with a first layer being coated onto a substrate 81, and a second layer 82b being coated onto the first layer 82a. In an embodiment, the second layer 82b comprises a $ThF_4$ layer of 750 nm thickness, and the first layer 82a comprises a ZnSe layer of 1250 nm thickness. In an embodiment, the substrate 81 may be an infrared absorbing $SiO2$ substrate. The multi-layer stack 83 may be a 40-layer Si/diamond multi-layer mirror that is on top of the second layer 82b of the anti-reflective coating 82. Although a capping layer is not illustrated in FIG. 6, in an embodiment, the spectral purity filter 80 may also include a capping layer.

Figure 8:
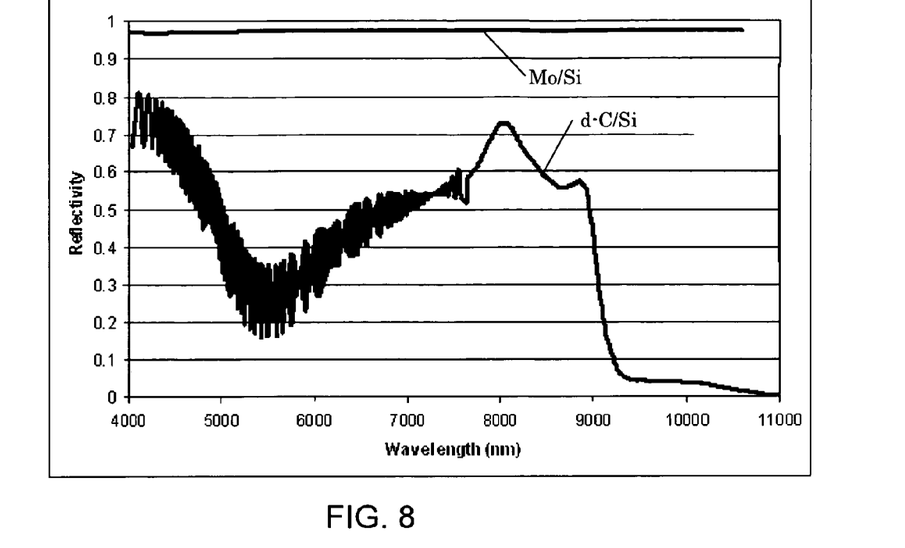
FIG. 8 is a graphical representation of reflectivity of a multi-layer mirror according to an embodiment of the invention.
Figure 9:
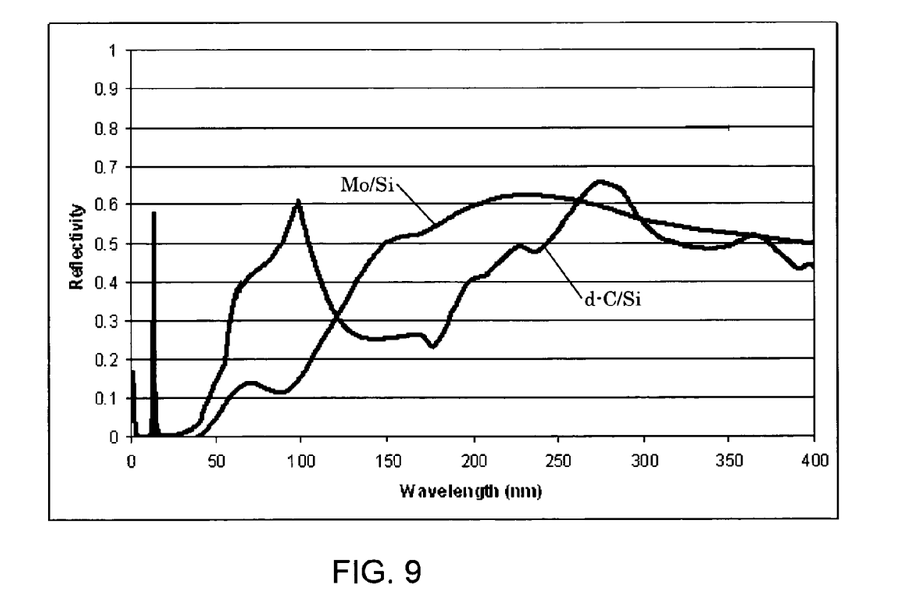
FIG. 9 is a graphical representation of reflectivity of a multi-layer mirror according to an embodiment of the invention.

FIGS. 8 and 9 illustrate the reflectivity (line d-C/Si) of the diamond/Si multi-layer mirror of FIG. 7 as compared to a Mo/Si multi-layer mirror in the infrared radiation (FIG. 8) and the DUV radiation (FIG. 9) ranges.

The EUV reflectivity of a diamond/Si multilayer mirror can be as high as 57.5% (density 3.5 $g/cm^3$), but will typically be around 51% when diamond-like carbon (DLC) is used (density 2.7 $g/cm^3$). For comparison, a Mo/Si multi-layer mirror can have a reflectivity up to 70%, and thus the spectral purity filter may have an EUV efficiency between 73-82%. The infrared radiation reflectivity is below 2% (but can be further reduced), and there is a modest DUV suppression of around 50% within the 130-200 nm range (without using an SPE layer).

Embodiments of the invention can provided a normal incidence spectral purity filter, for example a normal incidence mirror configured to reflect EUV radiation and to suppress reflection of other types of radiation (for example infrared and DUV radiation). The filter can be applied to filter radiation at relatively large range of angles of incidence, providing surprisingly good filtering achievements at each of the angles of incidence. Besides, in case of a substantially normal angle of incidence (of radiation to be processed by the filter), filtering of different radiation polarization directions can be achieved. Thus, the filter can provide good suppression of unpolarized (infrared and/or DUV) radiation.

Any suitable method may be used to construct embodiments of the spectral purity filter described herein. For example, multilayer stacks comprising DLC layers with a density of up to 2.7 g/cm3 may be deposited using pulsed laser deposition or ion beam sputter deposition.

It will be appreciated that embodiments of the invention may be used for any type of EUV source, including but not limited to a discharge produced plasma source (DPP source), or a laser produced plasma source (LPP source). However, an embodiment of the invention may be particularly suited to suppress radiation from a laser source, which typically forms part of a laser produced plasma source. This is because such a plasma source often outputs secondary radiation arising from the laser.

The spectral purity filter may be located practically anywhere in the radiation path. In an embodiment, the spectral purity filter is located in a region that receives EUV-containing radiation from the EUV radiation source and delivers the EUV radiation to a suitable downstream EUV radiation optical system, wherein the radiation from the EUV radiation source is arranged to pass through the spectral purity filter prior to entering the optical system. In an embodiment, the spectral purity filter is in the EUV radiation source. In an embodiment, the spectral purity filter is in the EUV lithographic apparatus, such as in the illumination system or in the projection system. In an embodiment, the spectral purity filter is located in a radiation path after the plasma but before the collector.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

For example, the anti-reflective coating and the multi-layer stack may be different parts of the filter (the stack being located on top of the anti-reflecting coating). For example the anti-reflective coating and the multi-layer stack together result in the anti-reflective properties of the embodiment.

According to an embodiment, the anti-reflective coating can be part of the multi-layer stack, that is, a multi-layer stack can be configured to be the anti-reflective coating, in addition to reflecting extreme ultraviolet radiation. In that case, the multi-layer stack (acting as anti-reflective coating) can be located on the top surface of the substrate. For example, in an embodiment, the anti-reflective properties of the anti-reflective structure can be at least partly due to, and desirably totally due to, the properties or configuration of the multi-layer stack.

For example, the integrated anti-reflective coating, as part of the multi-layer stack, can be provided by a relatively thick multi-layer stack, for example a thick DLC/Si multilayer. Such a thick stack can include, for example, over 50 periods, particularly for example 136 periods (each period including two layers of different materials, for example a DLC layer and a Si layer). It is expected that a resulting anti-reflective multi layer stack can still provide 82% infrared radiation reflection suppression.

What is claimed is:

1. A spectral purity filter configured to reflect extreme ultraviolet radiation, the spectral purity filter comprising:
    a substrate;
    an anti-reflective coating on a top surface of the substrate, the anti-reflective coating being configured to transmit infrared radiation; and
    a multi-layer stack on a top surface of the anti-reflective coating, the multi-layer stack being configured to reflect extreme ultraviolet radiation and to substantially transmit infrared radiation.

2. The spectral purity filter according to claim 1, further comprising a capping layer on a top surface of the multi-layer stack, the capping layer comprising at least one material selected from the group consisting of $Si_3N_4$, diamond, and carbon.

3. The spectral purity filter according to claim 1, wherein the substrate comprises at least one material selected from the group consisting of $SiO_2$, $Al_2O_3$, Si and TaN.

4. The spectral purity filter according to claim 1, wherein the substrate is configured to:
    substantially absorb the infrared radiation received from the anti-reflective coating; or
    substantially transmit the infrared radiation received from the anti-reflective coating.

5. The spectral purity filter according to claim 1, wherein the anti-reflective coating comprises at least one material selected from the group consisting of Ge, ZnSe, ZnS, $YF_3$ and $ThF_4$.

6. The spectral purity filter according to claim 1, wherein the anti-reflective coating comprises a first layer and a second layer, the first layer comprising ZnSe, and the second layer comprising $ThF_4$.

7. The spectral purity filter according to claim 1, wherein the multi-layer stack comprises at least one material selected from the group consisting of ZrN, ZrC, $Mo_2C$, Si, C, and diamond-like carbon.

8. The spectral purity filter according to claim 7, wherein the multi-layer stack comprises alternating layers of Si and diamond-like carbon.

9. The spectral purity filter according to claim 1, wherein the multi-layer stack comprises plurality of diffusion barrier layers substantially non-reflective to infrared radiation.

10. The spectral purity filter according to claim 9, wherein the diffusion barrier layers comprise $B_4C$.

11. The spectral purity filter according to claim 1, further comprising a backing plate located on a side of the substrate that is opposite the anti-reflective coating, the backing plate being constructed and arranged to transfer heat away from the substrate.

12. The spectral purity filter according to claim 1, wherein the substrate is transparent to infrared radiation.

13. The spectral purity filter according to claim 12, further comprising a second anti-reflective coating located on a side of the substrate that is opposite the anti-reflective coating, the second anti-reflective coating being substantially transparent to infrared radiation.

14. A lithographic apparatus comprising:
    a spectral purity filter configured to reflect extreme ultraviolet radiation, the spectral purity filter comprising:
        a substrate,
        an anti-reflective coating on a top surface of the substrate, the anti-reflective coating being configured to transmit infrared radiation, and
        a multi-layer stack on a top surface of the anti-reflective coating, the multi-layer stack being configured to reflect extreme ultraviolet radiation and to substantially transmit infrared radiation; and
    a projection system configured to project a patterned beam of radiation comprising the extreme ultraviolet radiation.

15. A radiation source comprising:
    a spectral purity filter configured to reflect extreme ultraviolet radiation, the spectral purity filter comprising:
        a substrate,
        an anti-reflective coating on a top surface of the substrate, the anti-reflective coating being configured to transmit infrared radiation, and
        a multi-layer stack on a top surface of the anti-reflective coating, the multi-layer stack being configured to reflect extreme ultraviolet radiation and to substantially transmit infrared radiation.

* * * * *